United States Patent
Huang

(10) Patent No.: US 11,189,357 B1
(45) Date of Patent: Nov. 30, 2021

(54) PROGRAMMABLE MEMORY DEVICE

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/989,268

(22) Filed: Aug. 10, 2020

(51) Int. Cl.
*G11C 17/00* (2006.01)
*G11C 17/16* (2006.01)
*H01L 27/112* (2006.01)

(52) U.S. Cl.
CPC ........ *G11C 17/16* (2013.01); *H01L 27/11206* (2013.01)

(58) Field of Classification Search
CPC ..................................... G11C 17/16
USPC ........................................... 365/96
See application file for complete search history.

(56) References Cited

U.S. PATENT DOCUMENTS

| | | | |
|---|---|---|---|
| 2007/0205485 A1* | 9/2007 | Hsu ...................... | H01L 27/1203 257/530 |
| 2008/0042235 A1* | 2/2008 | Kodama ........... | H01L 27/11206 257/530 |
| 2013/0147008 A1* | 6/2013 | Poppe ................. | H01L 23/5256 257/529 |

\* cited by examiner

*Primary Examiner* — Hoai V Ho
(74) *Attorney, Agent, or Firm* — Muncy, Geissler, Olds & Lowe, P.C.

(57) ABSTRACT

The present application provides a programmable memory device. The programmable memory device includes an active region, a gate structure and an anti-fuse storage unit. The active region is formed in a substrate and having a linear top view shape. The gate structure is disposed on the substrate and having a linear portion intersected with a section of the active region away from end portions of the active region. The anti-fuse storage unit uses a portion of the active region as a terminal, and further comprises an electrode and a dielectric layer. The electrode is disposed on the portion of the active region and spaced apart from the gate structure, and the dielectric layer is sandwiched between the portion of the active region and the electrode.

12 Claims, 20 Drawing Sheets

PROGRAMMABLE MEMORY DEVICE

TECHNICAL FIELD

The present disclosure relates to a programmable memory device, and more particularly, to an one-time-programmable (OTP) memory device.

DISCUSSION OF THE BACKGROUND

Nonvolatile memory devices can retain data even when their power supply is cut off. According to programmable times, the nonvolatile memory devices can be further divided into multi-time-programmable (MTP) memory devices and one-time-programmable (OTP) memory devices. Users can program a MTP memory device multiple times to modify the data stored in the MTP memory device. On the other hand, an OTP memory device can be only programmed once, and data stored in the OTP memory device cannot be modified.

Further, the OTP memory device may be classified into a fuse type and an anti-fuse type. The fuse type OTP memory device is short before being programmed, and open after being programmed. In contrast, the anti-fuse type OTP memory device is open before being programmed, and is short after being programmed. As compared to the fuse type OTP memory device, the anti-fuse type OTP memory device is more compatible with complementary metal-oxide-semiconductor (CMOS) fabricating process. Nevertheless, precisely controlling programming voltage of the anti-fuse type OTP memory device while scaling down the anti-fuse type OTP memory device is challenging.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a programmable memory device is provided. The programmable memory device comprises: an active region, formed in a substrate and having a linear top view shape; a gate structure, disposed on the substrate and having a linear portion intersected with a section of the active region away from end portions of the active region; and an anti-fuse storage unit, using a portion of the active region as a terminal, and further comprising an electrode and a dielectric layer, wherein the electrode is disposed on the portion of the active region and spaced apart from the gate structure, and the dielectric layer is sandwiched between the portion of the active region and the electrode.

In some embodiments, the gate structure is formed in a ring shape.

In some embodiments, one of the end portions of the active region is overlapped with a region laterally surrounded by the gate structure.

In some embodiments, the gate structure is closer to a first one of the end portions of the active region than to a second one of the end portions of the active region, and the anti-fuse storage unit is closer to the second one of the end portions of the active region than to the first one of the end portions of the active region.

In some embodiments, the programmable memory device further comprises an isolation structure formed in the substrate and laterally surrounding the active region.

In some embodiments, the gate structure is overlapped with the isolation structure and the section of the active region.

In some embodiments, the programmable memory device further comprises a gate dielectric layer selectively disposed between the gate structure and the section of the active region.

In some embodiments, a thickness of the gate dielectric layer is different from a thickness of the dielectric layer of the anti-fuse storage unit.

In some embodiments, the programmable memory device further comprises a gate spacer covering a sidewall of the gate structure.

In some embodiments, the programmable memory device further comprises a contact plug disposed on the gate structure and electrically connected to the gate structure.

In some embodiments, the contact plug is spaced apart from the active region.

In some embodiments, a top surface of the contact plug is substantially coplanar with a top surface of the electrode of the anti-fuse storage unit.

In another aspect of the present disclosure, a memory device is provided. The programmable memory device comprises: an access transistor, comprising an active region formed in a substrate and a gate structure formed on the substrate, wherein the active region has a linear top view shape, the gate structure has a first portion and a second portion, the first portion is intersected with a section of the active region away from end portions of the active region, and the second portion is laterally spaced apart from the active region; and a capacitor, using a portion of the active region as a terminal, and further comprising an electrode and a dielectric layer, wherein the electrode is disposed on the portion of the active region and spaced apart from the gate structure, and at least a portion of the dielectric layer is sandwiched between the electrode and the portion of the active region.

In some embodiments, the first and second portion of the gate structure are connected with each other.

In some embodiments, one of the end portions of the active region is located between the first and second portions of the gate structure.

As above, the programmable memory device according to embodiments of the present disclosure is a memory cell in an anti-fuse OTP memory array, and includes an access transistor and an anti-fuse storage unit connected to one of the source and drain terminal of the access transistor. The access transistor includes an active region formed in a substrate, and includes a gate structure formed on the substrate. The active region has a linear top view shape, and the gate structure has a linear portion intersected with a section of the active region. Such section of the active region is away from two end portions of the active region, which are particularly susceptible to lithography and/or etching inaccuracy. Therefore, an overlap area of the gate structure and the active region can be better controlled, thus a gate coupling area and a threshold voltage of the access transistor can be less affected by inaccuracy of the manufacturing process of the memory device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
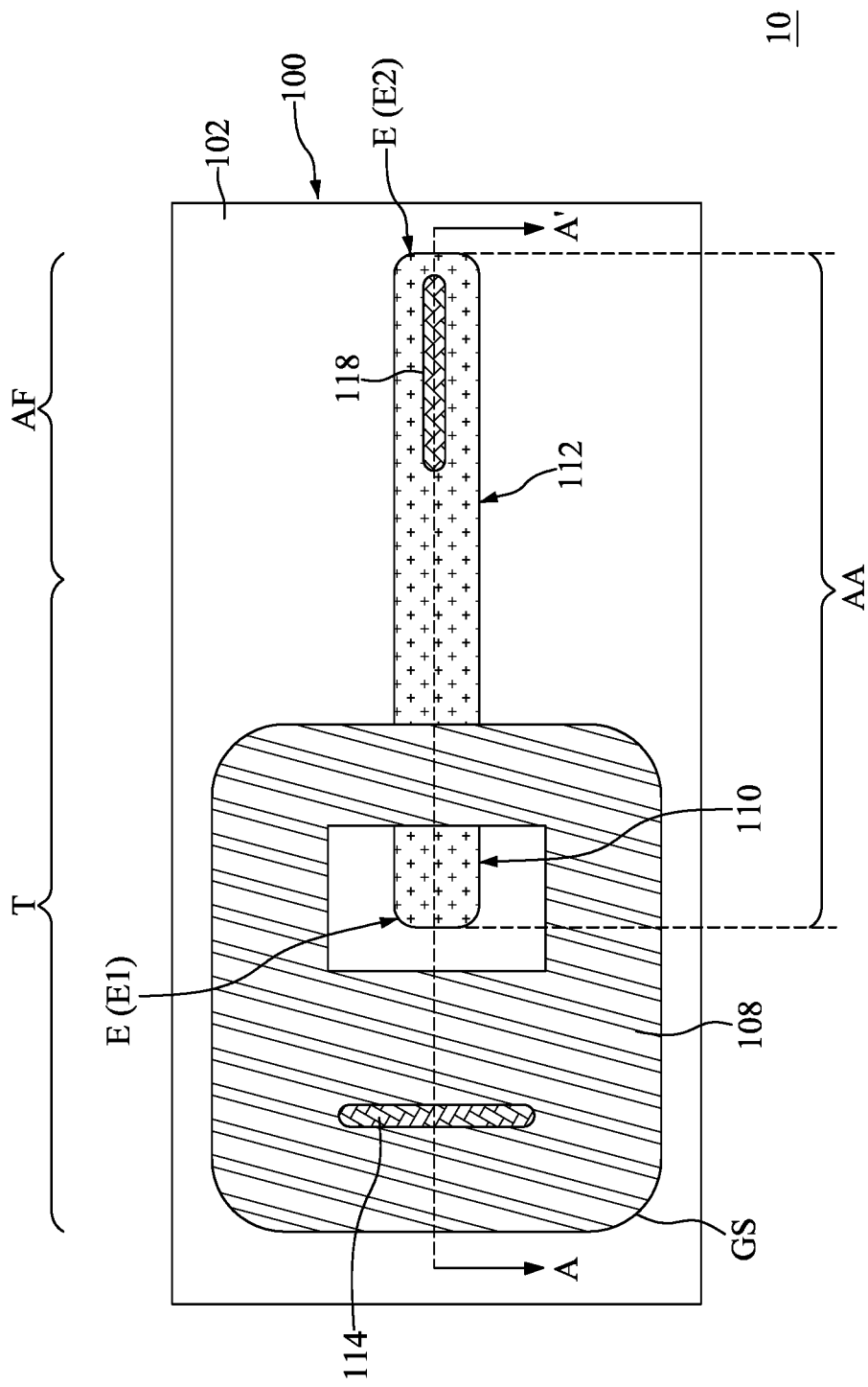
FIG. 1A is a schematic plan view of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
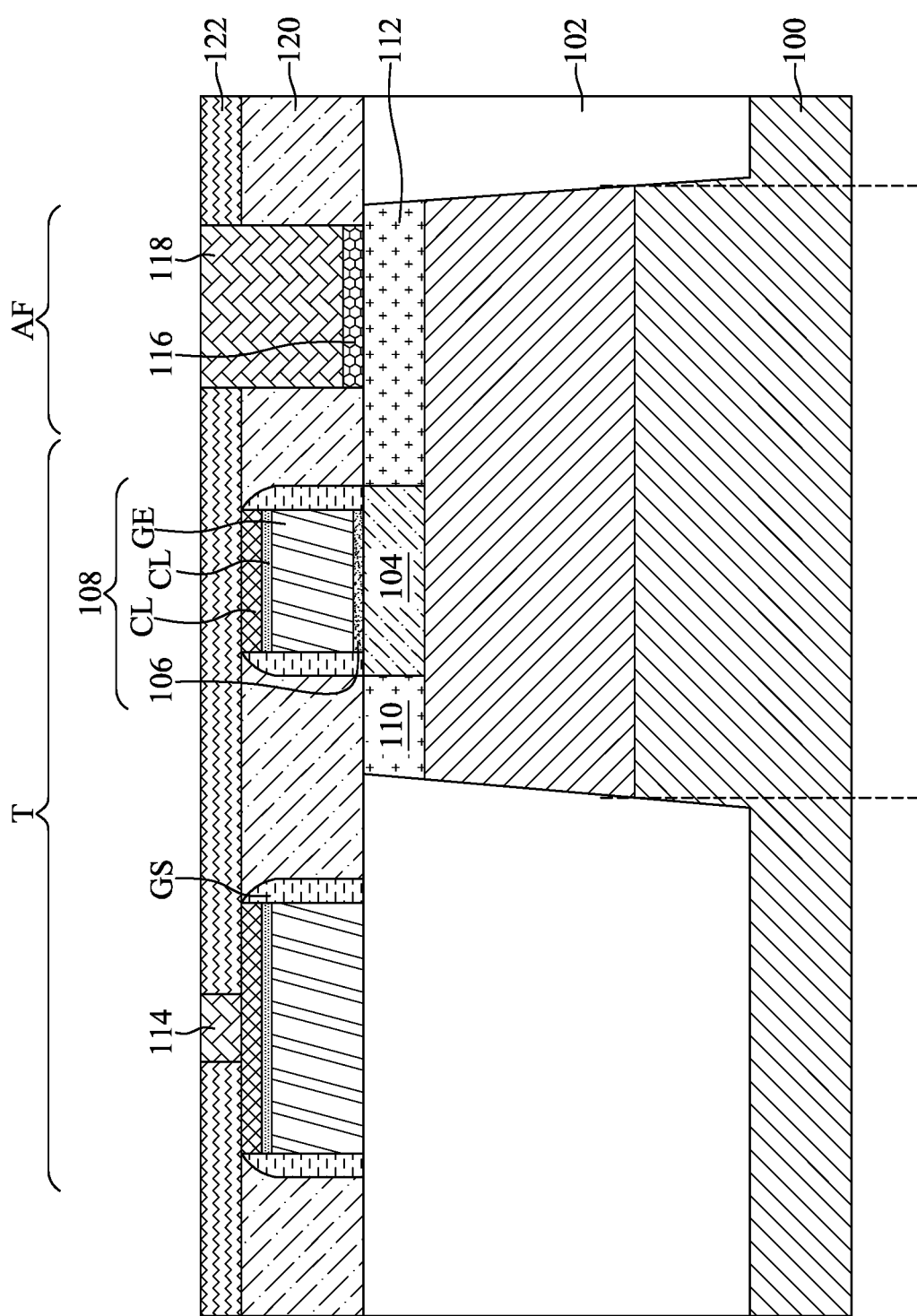
FIG. 1B is a schematic cross-sectional view along line A-A' shown in FIG. 1A.

FIG. 1A is a schematic plan view of a memory device 10 according to some embodiments of the present disclosure. FIG. 1B is a schematic cross-sectional view along line A-A' shown in FIG. 1A.

Referring to FIG. 1A and FIG. 1B, in some embodiments, the memory device 10 is a memory cell in an anti-fuse one-time-programmable (OTP) memory array. In such embodiments, the memory device 10 includes an access transistor T and an anti-fuse storage unit AF. The anti-fuse storage unit AF is electrically connected to a source/drain terminal of the access transistor T. When the memory device 10 is selected to be programmed, the access transistor T is turned on, and a large bias voltage across the anti-fuse storage unit AF results in dielectric breakdown of the anti-fuse storage unit AF. Accordingly, a permanent conductive path is formed across the anti-fuse storage unit AF, and a resistance of the anti-fuse storage unit AF is significantly decreased. On the other hand, if the memory device 10 is not selected during a programming operation, the memory device 10 remains in a high resistance state. During a read operation, the access transistor T is also turned on, and a current flowing through the access transistor T and the anti-fuse storage unit AF is detected by, for example, a sense amplifier (not shown) connected to the anti-fuse OTP memory array. If the memory device 10 has been selected to be programmed, a low resistance state of the anti-fuse storage unit AF can be detected. In contrast, if the memory device 10 has not been selected to be programmed, a high resistance state of the anti-fuse storage unit AF can be identified.

An active region AA of the access transistor T is defined in a substrate 100. The active region AA is a well region containing source, drain and channel regions of the access transistor T, and one of the source and drain regions (e.g., the doped regions 110, 112 to be described in the following paragraphs) is also functioned as a terminal of the anti-fuse storage unit AF. The substrate 100 may be a semiconductor wafer or a semiconductor-on-insulator (SOI) wafer. For instance, a semiconductor material of the semiconductor wafer or the SOI wafer may include an elemental semiconductor (e.g., Si, Ge or the like), a compound semiconductor (e.g., a group III-V compound semiconductor, SiC or the like), a semiconductor alloy (e.g., SiGe or a group III-V semiconductor alloy) or combinations thereof. In some embodiments, the substrate 100 is doped with a first conductive type or a second conductive type complementary to the first conductive type. For instance, the first conductive type may be N-type, and the second conductive type may be P-type, or vice versa.

The active region AA may be defined in the substrate 100 by an isolation structure 102. To be more specific, the active regions AA may be laterally surrounded by the isolation structure 102. In some embodiments, as shown in FIG. 1B, the isolation structure 102 is a trench isolation structure. In such embodiments, the isolation structure 102 extends from a top surface of the substrate 100 into the substrate 100 by a depth. This depth of the isolation structure 102 may be greater than a depth of the active region AA. Alternatively, the depth of the isolation structure 102 may be less than or equal to the depth of the active region AA. The isolation structure 102 is made of an insulating material, such as silicon oxide, silicon nitride, silicon oxynitride or combinations thereof.

The access transistor T may include a channel region 104, a gate dielectric layer 106, a gate structure 108 and doped regions 110, 112. The gate structure 108 is functioned as a gate terminal of the access transistor T, and the doped regions 110, 112 are functioned as source and drain terminals of the access transistor T. Further, the channel region 104 and the doped regions 110, 112 are formed in a shallow part of the active region AA. The channel region 104 and the doped regions 110, 112 respectively extend from the top surface of the substrate 100 into the substrate 100 by a depth less than the depth of the active region AA, and the channel region 104 is located between the doped regions 110, 112. Further, the channel region 104 is overlapped with the gate dielectric layer 106 and the gate structure 108, and the gate dielectric layer 106 lies between the channel region 104 and the gate structure 108. In some embodiments, a conductive type of the channel region 104 is complementary to a conductive type of the doped regions 110, 112. For instance, if the access transistor T is a N-type transistor, the conductive type of the channel region 104 may be P-type, while the conductive type of the doped regions 110, 112 may be N-type. Alternatively, if the access transistor T is a P-type transistor, the conductive type of the channel region 104 may be N-type, while the conductive type of the doped regions 110, 112 may be P-type. In addition, a conductive type of the active region AA may be the same as the conductive type of the channel region 104, except that a doping concentration of the active region AA may be lower than a doping concentration of the channel region 104. In some embodiments, a material of the gate dielectric layer 106 may include silicon oxide or a high-k dielectric material (e.g., a dielectric material with dielectric constant greater than 4).

In some embodiments, the gate structure 108 includes a gate electrode GE and at least one contact layer CL lying on the gate electrode GE. For instance, as shown in FIG. 1B, two contact layers CL are stacked on the gate electrode GE. The gate electrode GE and the contact layers CL are respectively formed of a conductive material. In some embodiments, the conductive materials for forming the gate electrode GE and the contact layers CL are different from one another. For instance, the gate electrode GE may be made of polysilicon, a lower one of the contact layers CL may be made of titanium nitride, and an upper one of the contact layers CL may be made of tungsten. Further, the gate electrode GE may have a thickness much greater than the thicknesses of the contact layers CL. In addition, the thicknesses of the contact layers CL may be different from each other. For instance, the thickness of a lower one of the contact layers CL may be smaller than the thickness of an upper one of the contact layers CL. Moreover, in some embodiments, the access transistor T further includes a gate spacer GS. The gate spacer GS covers sidewalls of the gate dielectric layer 106 and the gate structure 108, and may be made of an insulating material (e.g., silicon oxide, silicon nitride, silicon oxynitride, the like or combinations thereof). In those embodiments where the gate structure 108 includes the contact layers CL lying on the gate electrode GE, a topmost surface of the contact layers CL may be slightly lower than a topmost end of the gate spacer GS. Although the gate spacer GS is depicted in FIG. 1A and FIG. 1B as a single layer, the gate spacer GS may alternatively include multiple layers made of the same or different insulating material(s).

As shown in FIG. 1A, the active region AA has a linear top view shape, and the gate structure 108 is formed in a ring shape. A portion of the active region AA is intersected with and covered by a linear portion of the gate structure 108. Such overlap portion of the active region AA is away from end portions E of the active region AA. In some embodiments, one of the end portions E (also labeled as an end portion E1) of the active region AA is overlapped with a region enclosed by the ring-shape gate structure 108, while the other end portion E (also labeled as an end portion E2) of the active region AA is distant from the gate structure 108. The channel region 104 is located in the portion of the active region AA overlapped with the gate structure 108, thus is not shown in FIG. 1A. On the other hand, the doped regions 110, 112 extends from the overlap portion to the end portions E1, E2 of the active region AA. In other words, the doped regions 110, 112 may not be covered by the gate structure 108. In some embodiments, the portion of the active region AA overlapped with the gate structure 108 is closer to the end portion E1 of the active region AA, than to the other end portion E2 of the active region AA. In such embodiments, one of the doped regions 110, 112 is larger than the other. For instance, as shown in FIG. 1A, the portion of the active region AA overlapped with the gate structure 108 is closer to the end portion E1 of the active region AA overlapped with the region enclosed by the gate structure 108, than to the end portion E2 of the active region AA that is distant from the gate structure 108. Accordingly, the doped region 112 extending to the end portion E2 of the active region AA distant from the gate structure 108 is larger than the doped region 110 extending to the end portion E1 of the active region AA. Moreover, in some embodiments, the gate dielectric layer 106 is selectively formed between the gate structure 108 and the active region AA (as shown in FIG. 1B). In these embodiments, a portion of the gate structure 108 is spaced apart from the active region AA by the gate dielectric layer 106, while the remainder portion of the gate structure 108 is in contact with the isolation structure 102 without agate dielectric layer in between.

Also referring to FIG. 1A, in some embodiments, the gate structure 108 is formed in nearly a rectangular ring shape that can be divided into four line sections. A first line section of the gate structure 108 (e.g., the right line section of the gate structure 108 as shown in FIG. 1A) is intersected with the active region AA. A second line section of the gate structure 108 (e.g., the left line section of the gate structure 108 as shown in FIG. 1A) is substantially parallel to the first line section of the gate structure 108. Third and fourth line sections of the gate structure 108 (e.g., upper and lower line sections of the gate structure 108 as shown in FIG. 1A) are substantially perpendicular to the first and second line sections of the gate structure 108, and extend between the first and second line sections of the gate structure 108. In some embodiments, a width of the second line section of the gate structure 108 is much greater than widths of the first, third and fourth line sections of the gate structure 108. In these embodiments, the region enclosed by the gate structure 108 is offset from a center of the gate structure. For instance, such region is offset from the center of the gate structure 108 to a right side of the gate structure 108 (as shown in FIG. 1A).

Furthermore, a contact plug 114 may be disposed on the gate structure 108. In those embodiments where the gate structure 108 includes the gate electrode GE and the contact layer(s) CL, the contact plug 114 stands on the contact layer(s) CL. In addition, in those embodiments where the gate structure 108 is formed in a nearly rectangular ring shape, the contact plug 114 stands on the line section of the gate structure 108 with a relatively large width (e.g., the second line section of the gate structure 108 as described with reference to FIG. 1A). Moreover, in some embodiments, as shown in FIG. 1A, the contact plug 114 has a linear top view shape, of which an extending direction is intersected with (e.g., perpendicular to) an extending direction of the linear-shape active region AA. The contact plug 114 is made of a conductive material. For instance, this conductive material may include tungsten, copper, the like or combinations thereof.

In some embodiments, the anti-fuse storage unit AF is a capacitor. During a programming operation, a large bias voltage is set across two terminals of the anti-fuse storage unit AF, such that these two terminals are shorted as a result of dielectric breakdown in between the terminals. In such embodiments, the anti-fuse storage unit AF includes a dielectric layer 116 disposed between the two terminals. The dielectric breakdown during a programming operation occurs at the dielectric layer 116. In some embodiments, the doped region 112 may be functioned as one of the terminals of the anti-fuse storage unit AF. In these embodiments, the dielectric layer 116 is disposed on the doped region 112. In some embodiments, a material of the dielectric layer 116 may be the same as the material of the gate dielectric layer 106. Alternatively, the dielectric layer 116 and the gate dielectric layer 106 may be made of different materials. In addition, in some embodiments, a thickness of the dielectric layer 116 may be greater than a thickness of the gate dielectric layer 106. In alternative embodiments, the thickness of the dielectric layer 116 may be equal to or less than the thickness of the gate dielectric layer 106. Further, the other one of the terminals of the anti-fuse storage unit AF may be an electrode 118 standing on the dielectric layer 116. In some embodiments, as shown in FIG. 1A, the electrode 118 is formed in a linear shape, and an extending direction of the linear-shape electrode 118 may be substantially aligned with an extending direction of the linear-shape active region AA. In these embodiments, the dielectric layer 116 sandwiched between the electrode 118 and the doped region 112 may have a linear shape as well, and a sidewall of the dielectric layer 116 may be substantially coplanar with a sidewall of the electrode 118. The electrode 118 is made of a conductive material. For instance, this conductive material may include tungsten, copper, the like or combinations thereof.

In some embodiments, insulating layers 120, 122 are stacked on the substrate 100. The gate dielectric layer 106, the gate structure 108 and the gate spacer GS of the access transistor T are formed in the insulating layer 120, and are laterally surrounded by the insulating layer 120. In some embodiments, a top surface of the insulating layer 120 is substantially aligned with the topmost end of the gate spacer GS, and slightly higher than a top surface of the topmost contact layer CL. In addition, the dielectric layer 116 and a lower part of the electrode 118 of the anti-fuse storage unit AF are formed in the insulating layer 120 as well, and are laterally surrounded by the insulating layer 120. On the other hand, the insulating layer 122 is disposed on the insulating layer 120. In this way, the top surface of the topmost contact layer CL of the access transistor T is covered by the insulating layer 122, and the contact plug 114 standing on the topmost contact layer CL is laterally surrounded by the insulating layer 122. Similarly, an upper part of the electrode 118 of the anti-fuse storage unit AF is laterally surrounded by the insulating layer 122. The insulating layers 120, 122 are respectively formed of an insulating material, such as silicon oxide, silicon nitride, silicon oxynitride or the like. In some embodiments, the insulating materials for forming the insulating layers 120, 122 may be different from each other. In alternative embodiments, the insulating layers 120, 122 may be made of the same insulating material.

As described above, the active region AA of the access transistor T in the memory device 10 is formed in a linear shape, and is intersected with a linear portion of the gate structure 108 at a section away from the two end portions E1, E2 of the active region AA. During manufacturing, the end portions E1, E2 of the active region AA are susceptible to lithography and/or etching inaccuracy, and dimensions and/or shapes of the end portions E1, E2 may distort from an original layout design. Consequently, if an active region of a transistor is overlapped with a gate structure at one of its end portion, it would be difficult to control a gate coupling area as well as threshold voltage of the transistor. In contrast, since embodiments of the present disclosure avoid from using any of the end portions E1, E2 of the active region AA as a gate coupling region of the access transistor T, the afore-mentioned problem may be effectively prevented. As a result, a gate coupling area and a threshold voltage of the access transistor T according to embodiments of the present disclosure can be better controlled.

Figure 2:
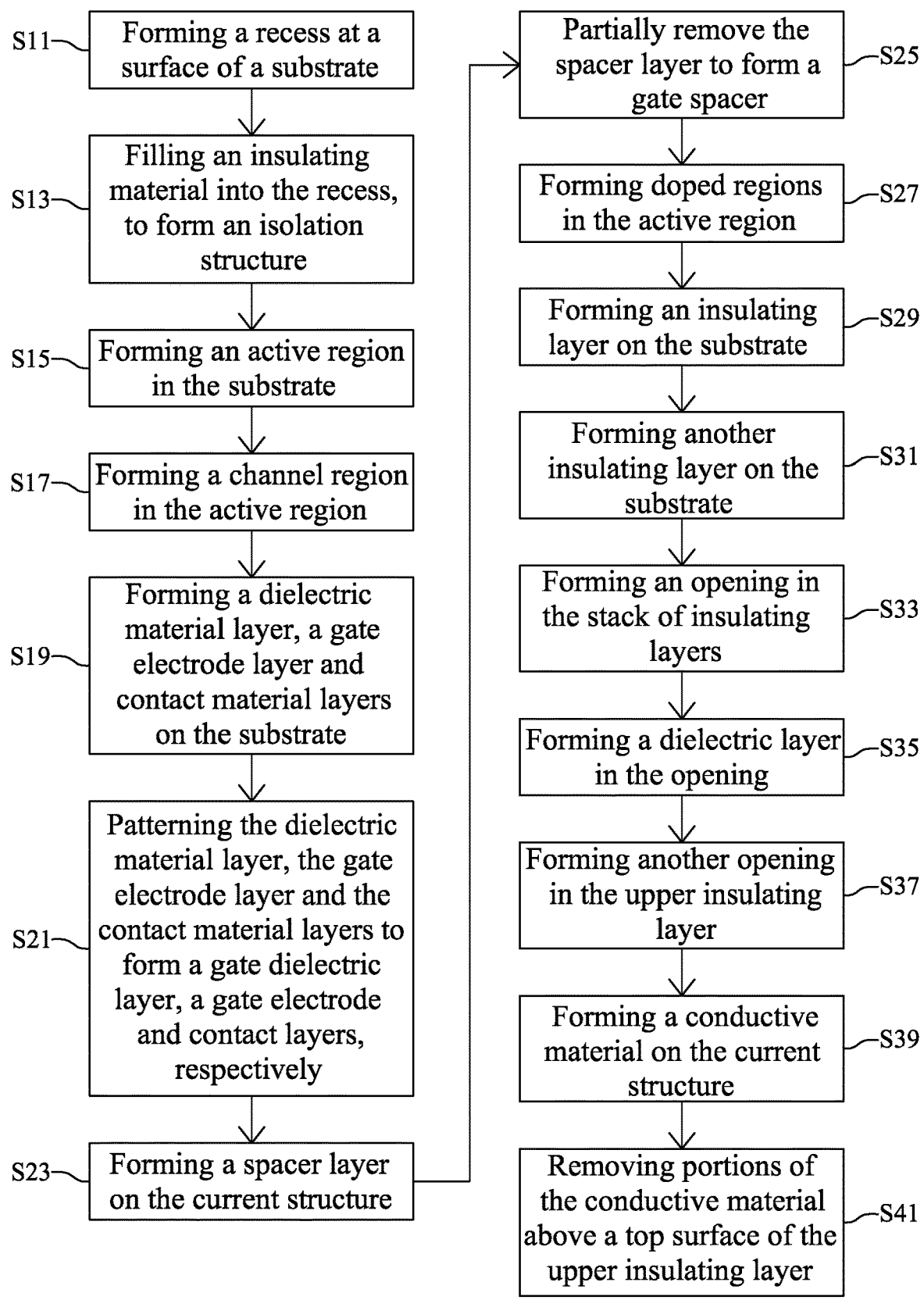
FIG. 2 is a flow diagram illustrating a manufacturing method of the memory device shown in FIG. 1A and FIG. 1B according to some embodiments of the present disclosure.
Figure 3A:
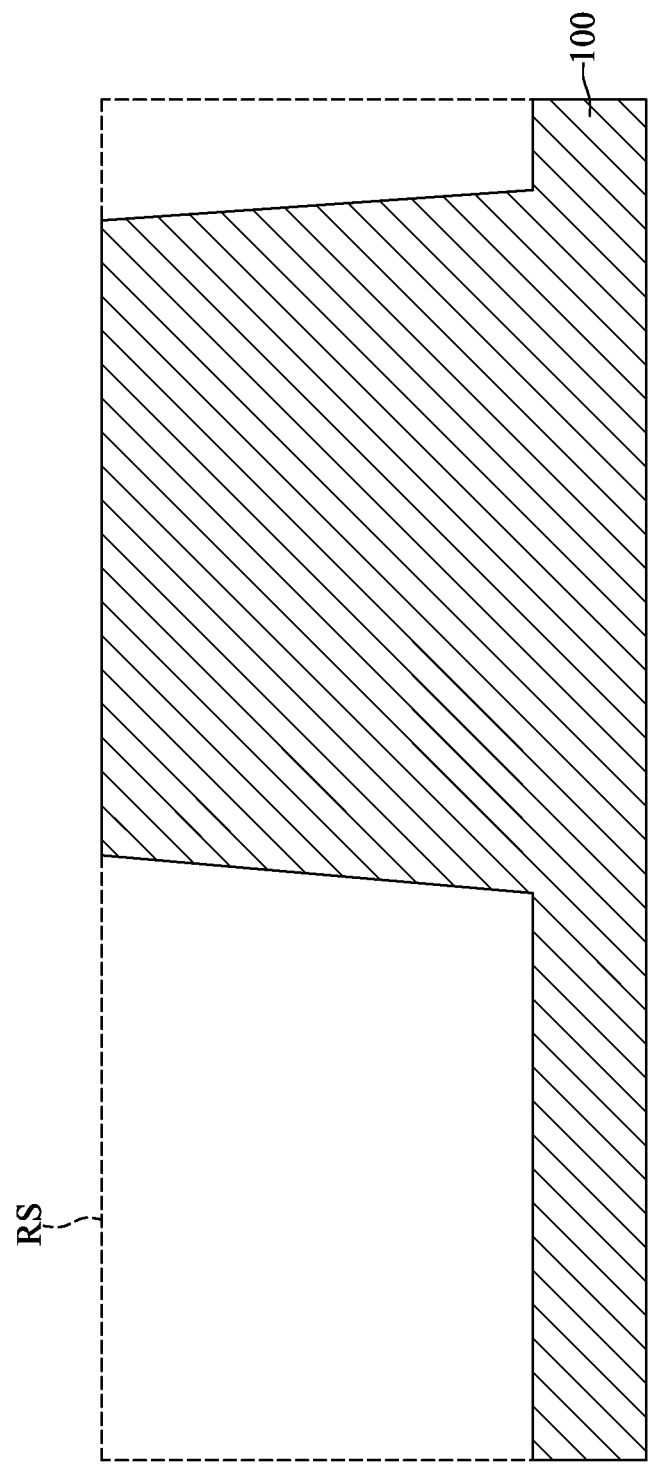
FIG. 3A through FIG. 3O are schematic cross-sectional views illustrating structures at various stages during the manufacturing process as shown in FIG. 2.

FIG. 2 is a flow diagram illustrating a manufacturing method of the memory device 10 shown in FIG. 1A and FIG. 1B according to some embodiments of the present disclosure. FIG. 3A through FIG. 3O are schematic cross-sectional views illustrating structures at various stages during the manufacturing process as shown in FIG. 2. It should be noted that, the cross-sectional views shown in FIG. 3A through FIG. 3O are cut along line A-A' as depicted in FIG. 1A.

Referring to FIG. 2 and FIG. 3A, step S11 is performed, and a recess RS is formed at a surface of the substrate 100. The recess RS defines a location of the subsequently formed isolation structure 102. In other words, the recess RS will accommodate the isolation structure 102 formed in the subsequent step. As described with reference to FIG. 1A, the active region AA is laterally surrounded by the isolation structure 102, thus a portion of the substrate 100 laterally surrounded by the recess RS defines a location of the subsequently formed active region AA. In some embodiments, a method for forming the recess RS may include a lithography process and an etching process (e.g., an anisotropic etching process).

Figure 3B:
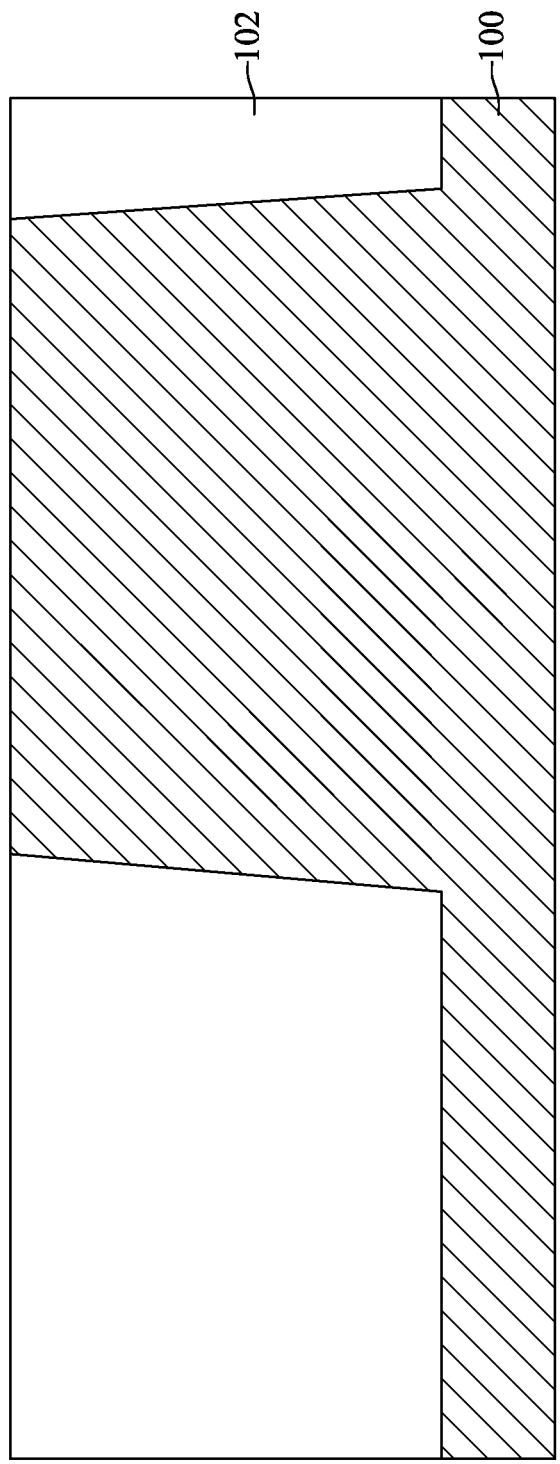

Referring to FIG. 2 and FIG. 3B, step S13 is performed, and an insulating material is filled into the recess RS, to form the isolation structure 102. The insulating material may be filled by a deposition process, such as a chemical vapor deposition (CVD) process. In some embodiments, the insulating material filling up the recess RS may initially extend onto the top surface of the substrate 100, and a planarization process may be further performed to remove portions of the insulating material above the top surface of the substrate 100. For instance, the planarization process may include a chemical mechanical polishing (CMP) process, an etching process or a combination thereof.

Figure 3C:
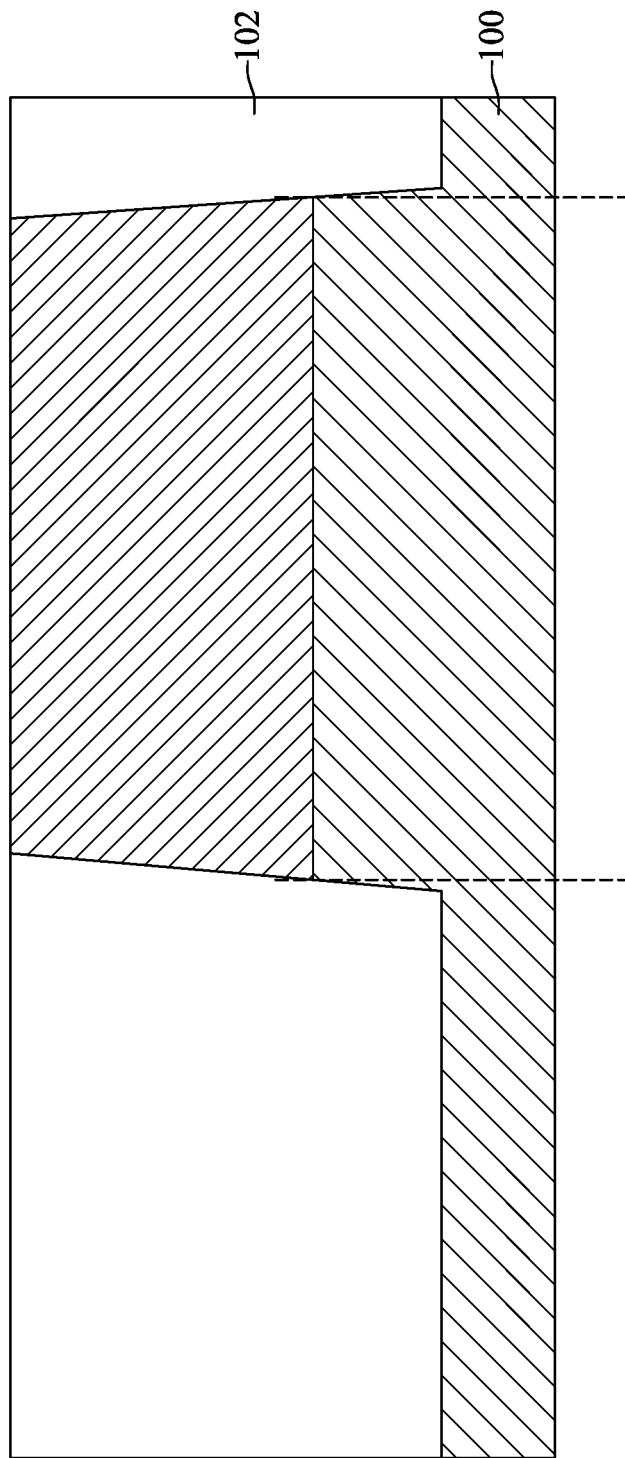

Referring to FIG. 2 and FIG. 3C, step S15 is performed, and the active region AA is formed. In some embodiments, a method for forming the active region AA includes performing an ion implantation process on the portion of the substrate 100 laterally surrounded by the isolation structure 102. In such embodiments, the isolation structure 102 may be functioned as a mask during the ion implantation process, and the formation of the active region AA can be regarded as a self-align process.

Figure 3D:
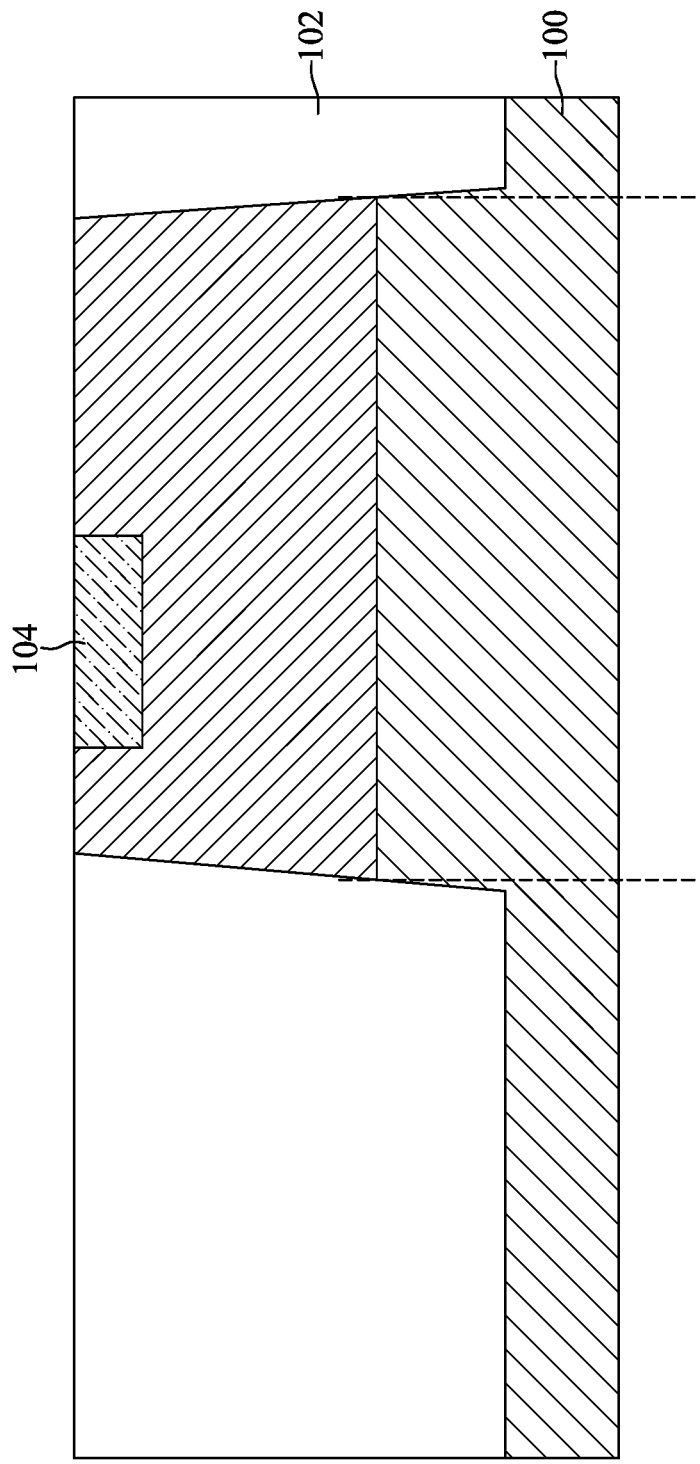

Referring to FIG. 2 and FIG. 3D, step S17 is performed, and the channel region 104 is formed in the active region AA. In some embodiments, a method for forming the channel region 104 includes forming a mask pattern (not shown) on the substrate 100. The mask pattern has an opening for defining a location of the channel region 104. After formation of the mask pattern, an ion implantation process is performed to form the channel region 104. The mask pattern is used to define a doping area (i.e., a span of the channel region 104) of such ion implantation process. After formation of the channel region 104, the mask pattern may be removed. In some embodiments, the mask pattern is a photoresist pattern. In alternative embodiments, the mask pattern is a hard mask pattern, and may be made of silicon oxide, silicon nitride, the like or combinations thereof.

Figure 3E:
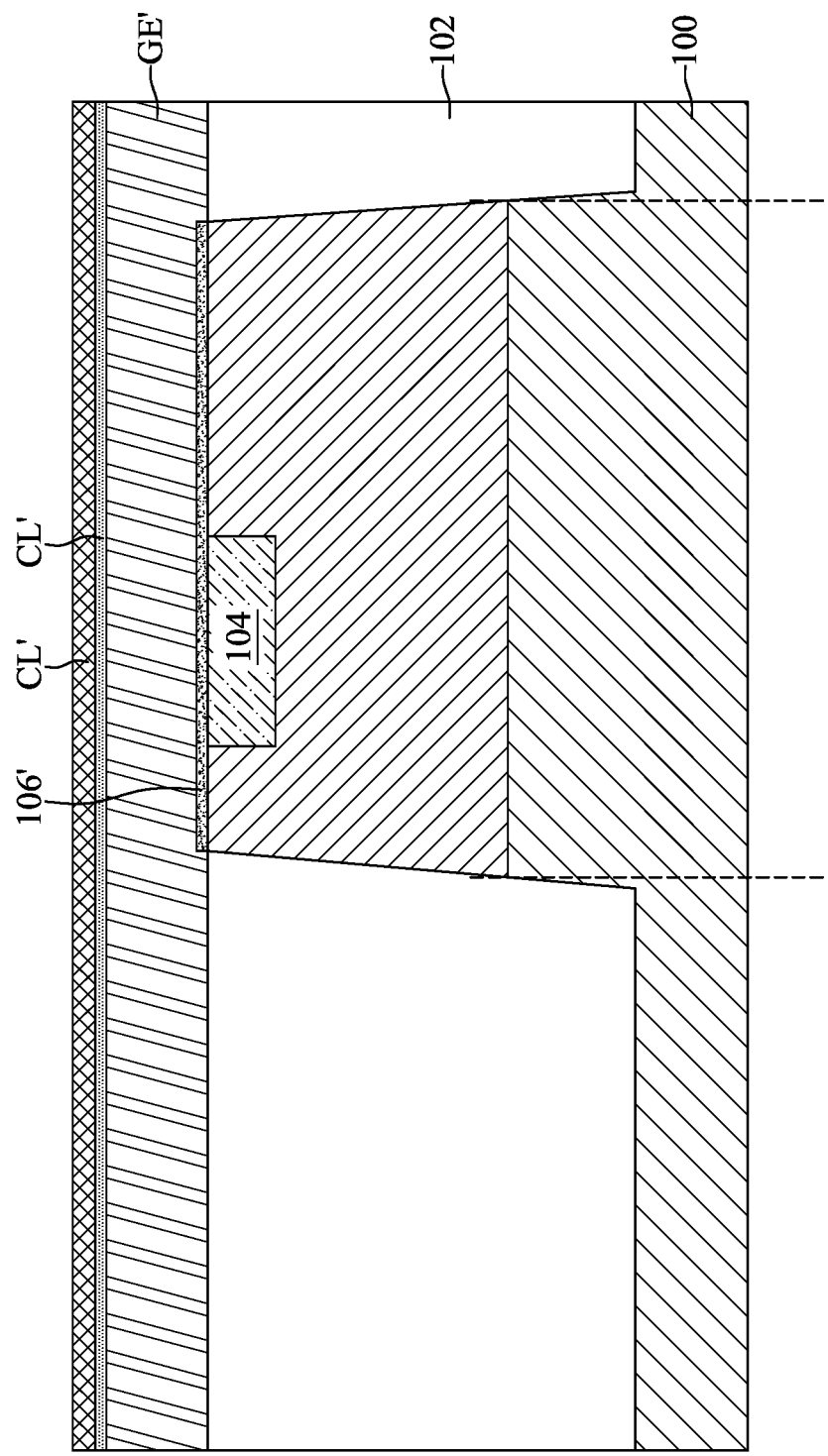

Referring to FIG. 2 and FIG. 3E, step S19 is performed, and a dielectric material layer 106', a gate electrode layer GE' and at least one contact material layer CL' (e.g., two contact material layers CL') are formed on the substrate 100. In some embodiments, the dielectric material layer 106' is selectively formed on the active region AA, while the gate electrode layer GE' and the contact material layers CL' are globally formed on the substrate 100. In such embodiments, a method for forming the gate dielectric material layer 106' may include an oxidation process, while methods for forming the gate electrode layer GE' and the contact material layers CL' may respectively include a deposition process (e.g., a CVD process). In alternative embodiments, the dielectric material layer 106' globally covers the substrate 100, and may be formed by a deposition process (e.g., a CVD process).

Figure 3F:
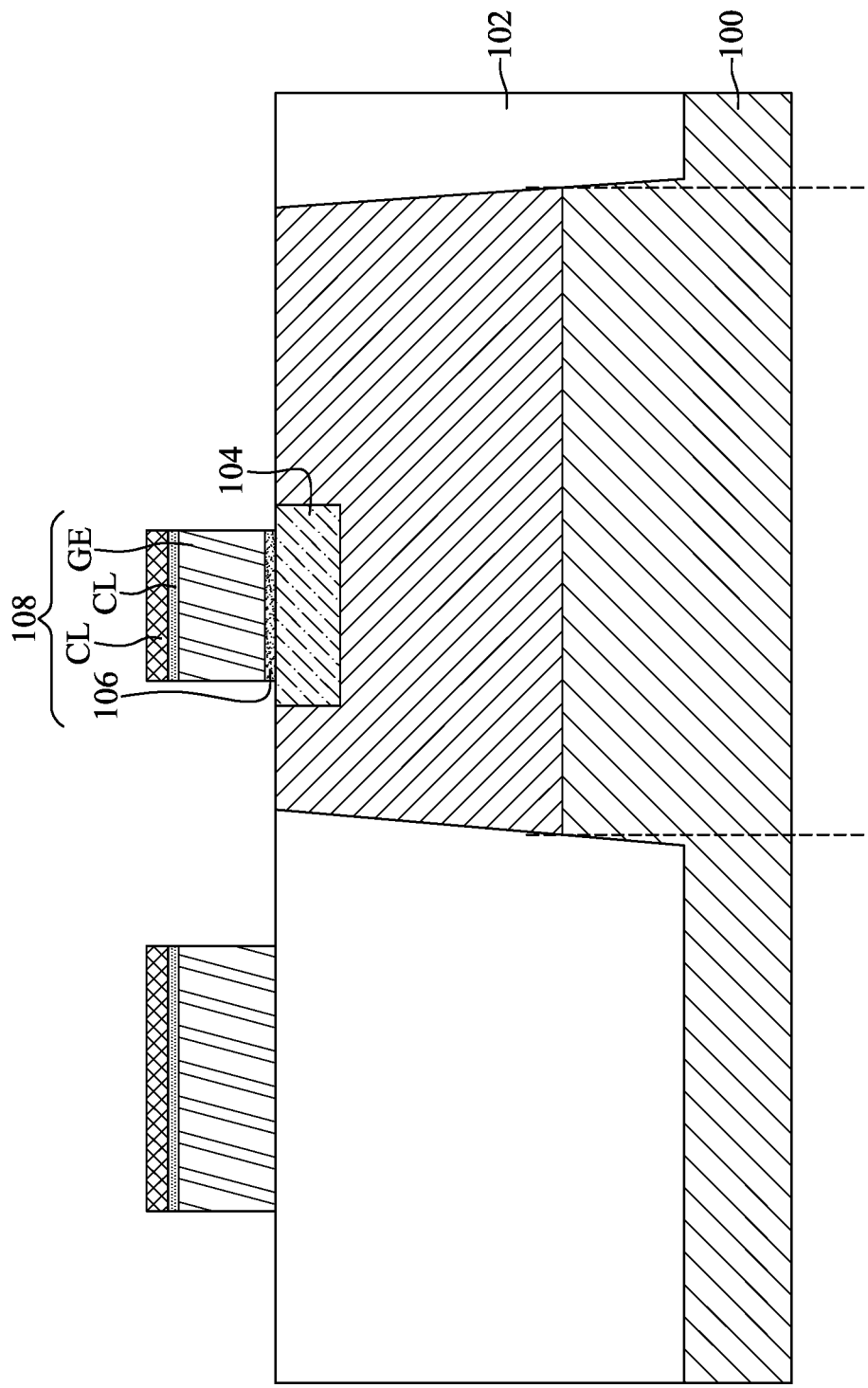

Referring to FIG. 2 and FIG. 3F, step S21 is performed, and the dielectric material layer 106', the gate electrode layer GE' and the contact material layers CL' are patterned to form the gate dielectric layer 106, the gate electrode GE and the contact layers CL, respectively. The gate dielectric layer 106 and a portion of the gate structure 108 (including the gate electrode GE and the contact layers CL) overlap the channel region 104. In some embodiments, a method for patterning these layers includes a lithography process and one or more etching process(es).

Figure 3G:
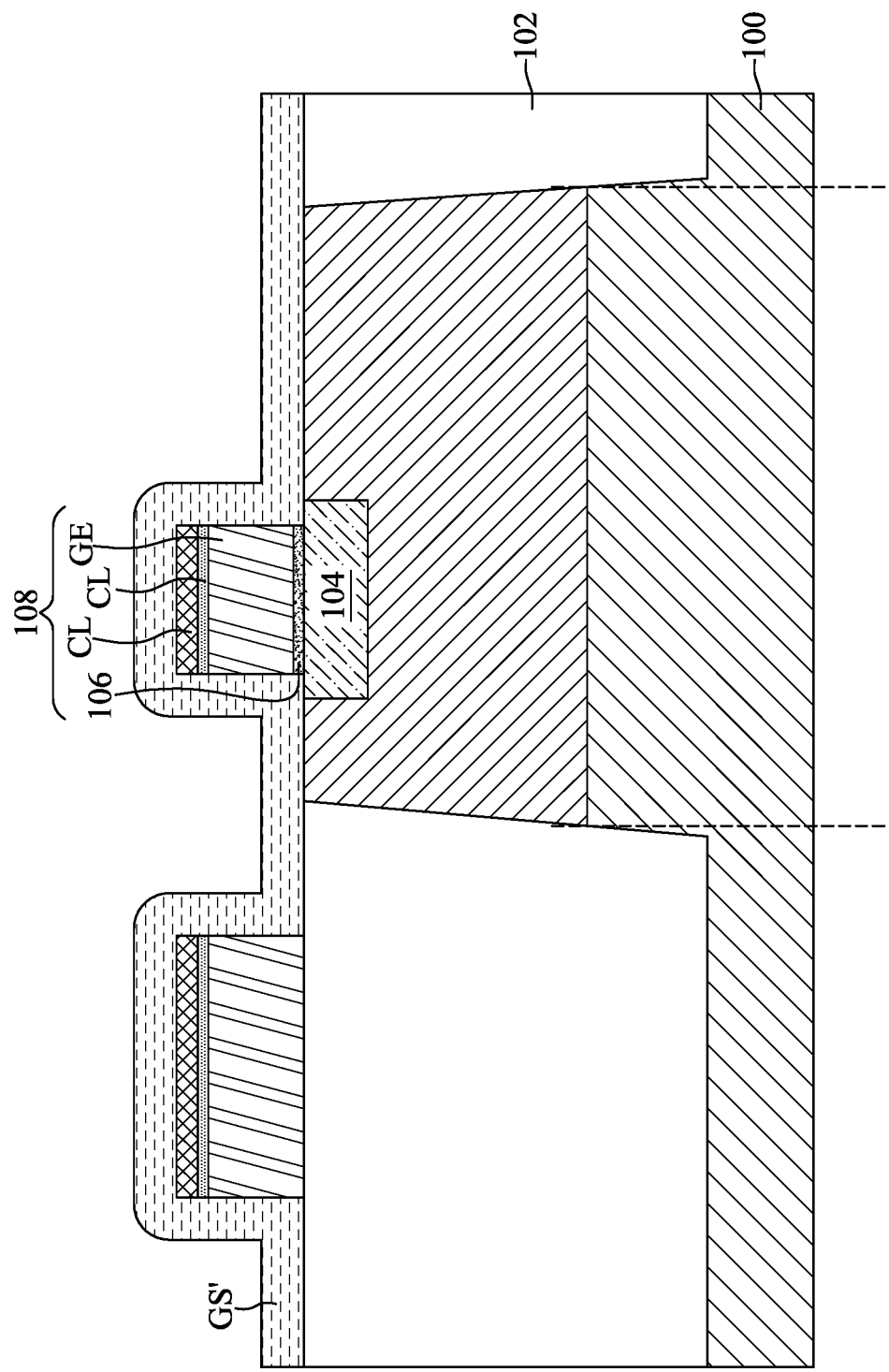

Referring to FIG. 2 and FIG. 3G, step S23 is performed, and a spacer layer GS' is formed on the current structure. The spacer layer GS' may globally cover the exposed surfaces of isolation structure 102, the active region AA, the channel region 104, the gate dielectric layer 106 and the gate structure 108. In some embodiments, a method for forming the spacer layer GS' includes a deposition process, such as a CVD process.

Figure 3H:
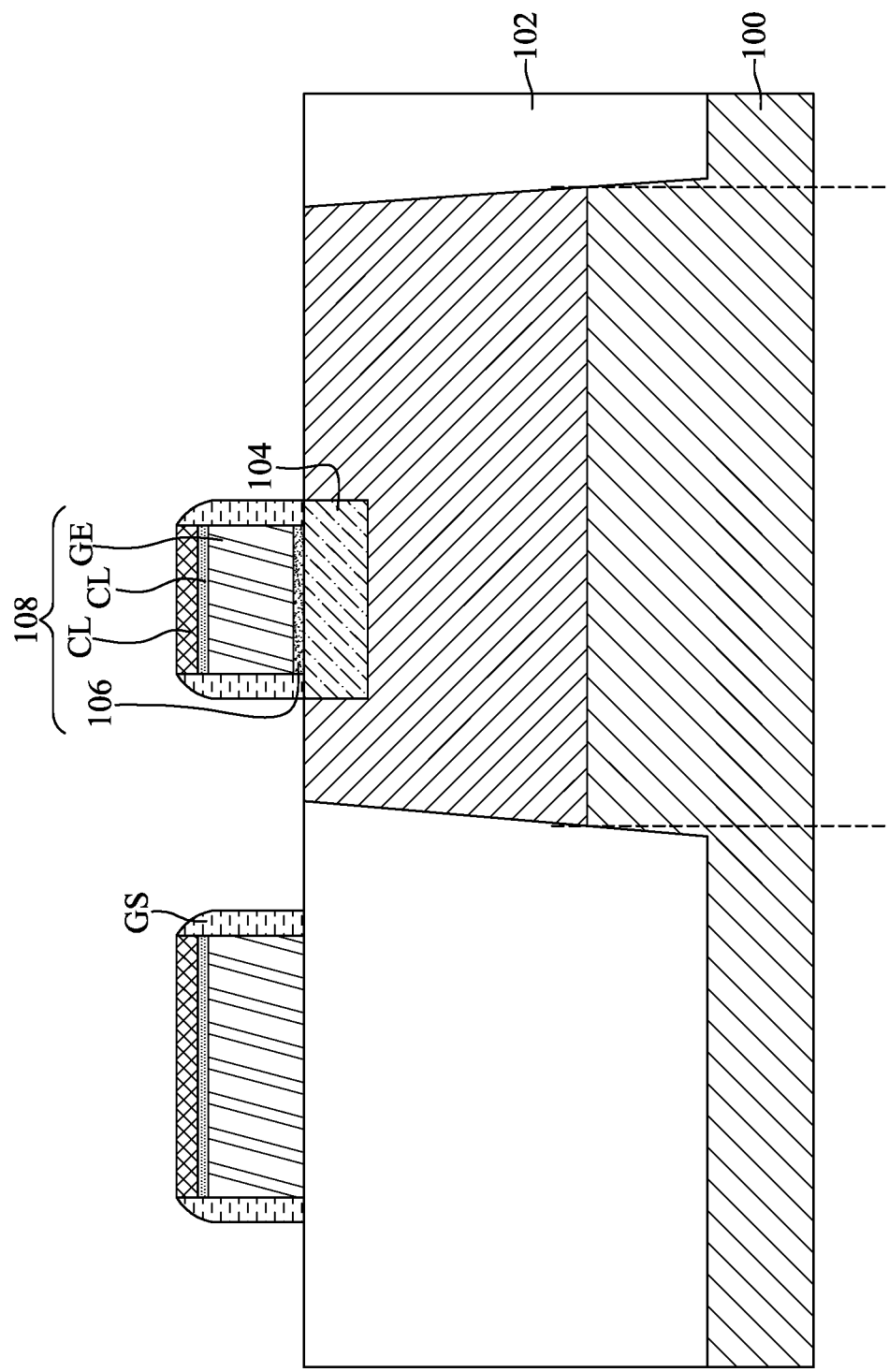

Referring to FIG. 2 and FIG. 3H, step S25 is performed, and the spacer layer GS' is partially removed, to form the gate spacer GS. In some embodiments, a method for forming the gate spacer GS includes performing an anisotropic etching process. During the anisotropic etching process, horizontally extending portions of the spacer layer GS' are removed, while vertically extending portions of the spacer layer GS' are shaped to form the gate spacer GS. Moreover, in some embodiments, a skin portion of the topmost contact layer CL may be consumed during the anisotropic etching process. As a result, a top surface of the topmost contact layer CL may be slightly lower than the topmost end of the gate spacer GS.

Figure 3I:
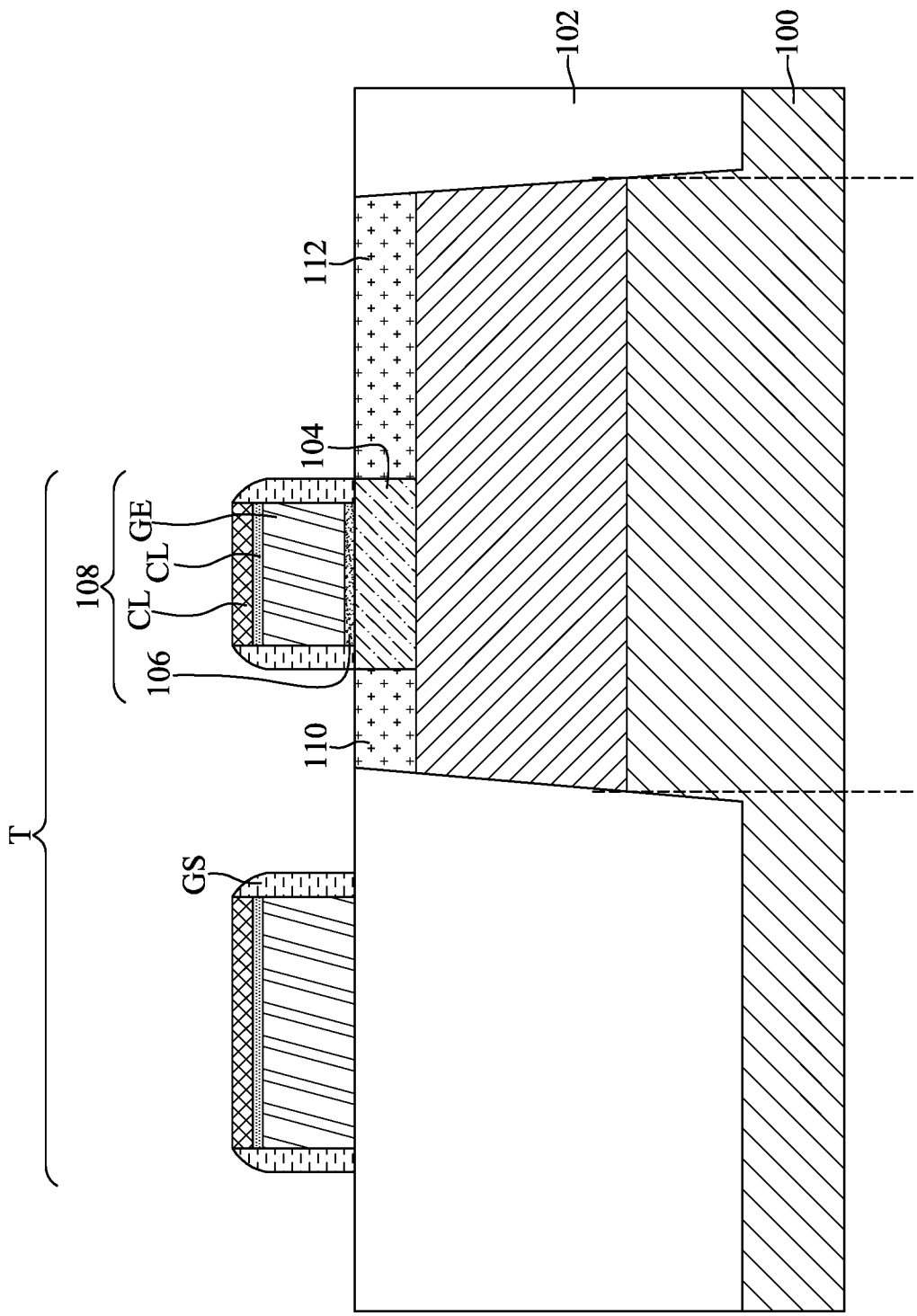

Referring to FIG. 2 and FIG. 3I, step S27 is performed, and doped regions 110, 112 are formed in the active region AA. A method for forming the doped regions 110, 112 may include an ion implantation process. During such ion implantation process, the gate structure 108, the gate spacer GS and the isolation structure 102 are functioned as masks, such that the formation of the doped regions 110, 112 can be a self-align process. Portions of the active region AA not covered by the gate structure 108 and the gate spacer GS may be subjected to the ion implantation process, while a portion of the active region AA covered by the gate structure 108 and the gate spacer GS is not. Further, a thermal treatment may be performed, such that dopants implanted into the exposed portions of the active region AA may diffuse to a region covered by the gate spacer GS.

Figure 3J:
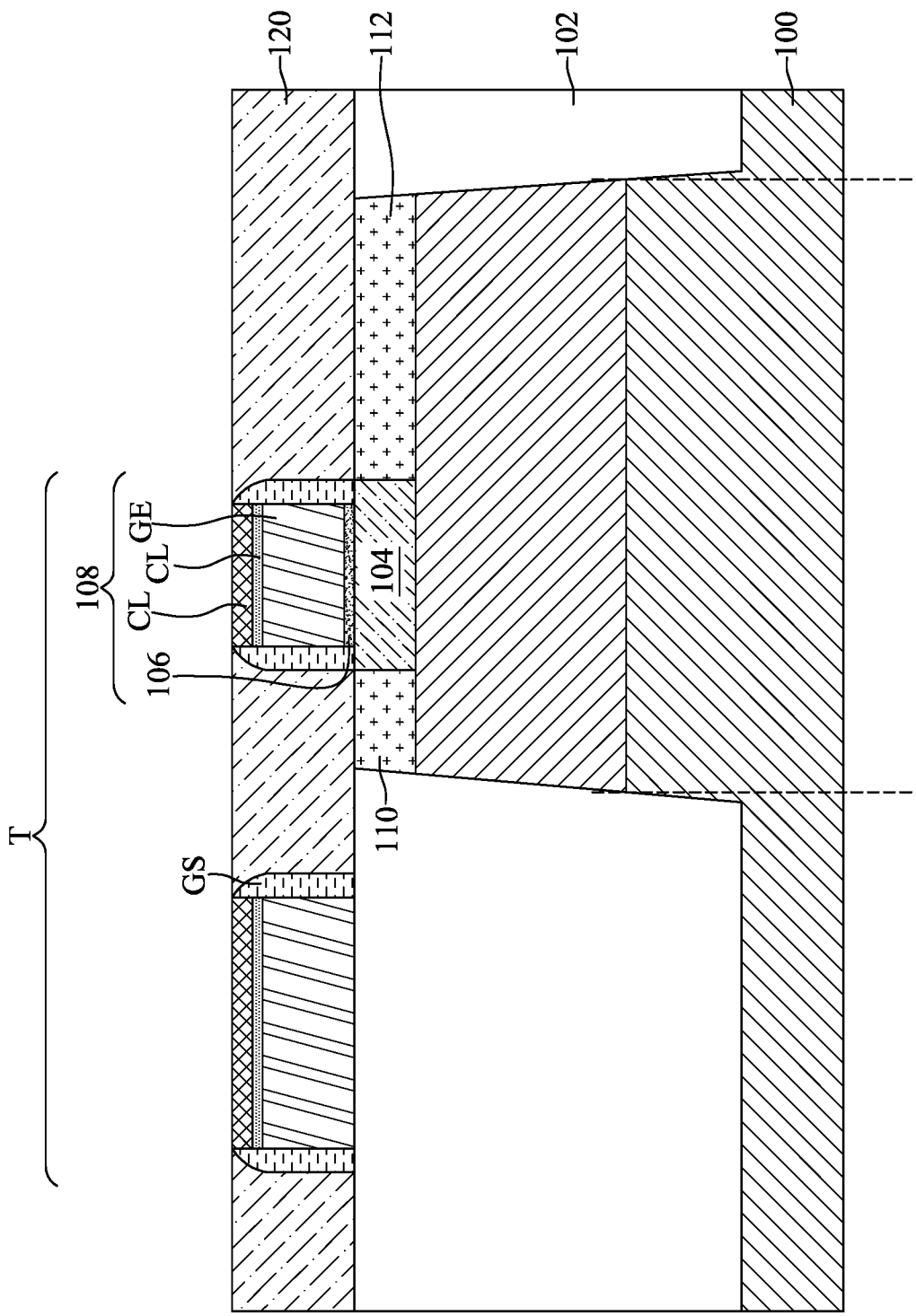

Referring to FIG. 2 and FIG. 3J, step S29 is performed, and the insulating layer 120 is formed on the substrate 100. In some embodiments, a method for forming the insulating layer 120 includes a deposition process, such as a CVD process. The insulating layer 120 may initially cover a top surface of the gate structure 108, then a planarization process may be performed to remove portions of the insulating layer 120 above the top surface of the gate structure 108. The gate structure 108 and the gate spacer GS are laterally surrounded by the eventually formed insulating layer 120. The planarization process may include, for example, a CMP process, an etching process or a combination thereof. In some embodiments, a skin portion of the topmost contact layer CL may be consumed during the planarization process. As a result, a top surface of the topmost contact layer CL may be slightly lower than the topmost end of the gate spacer GS.

Figure 3K:
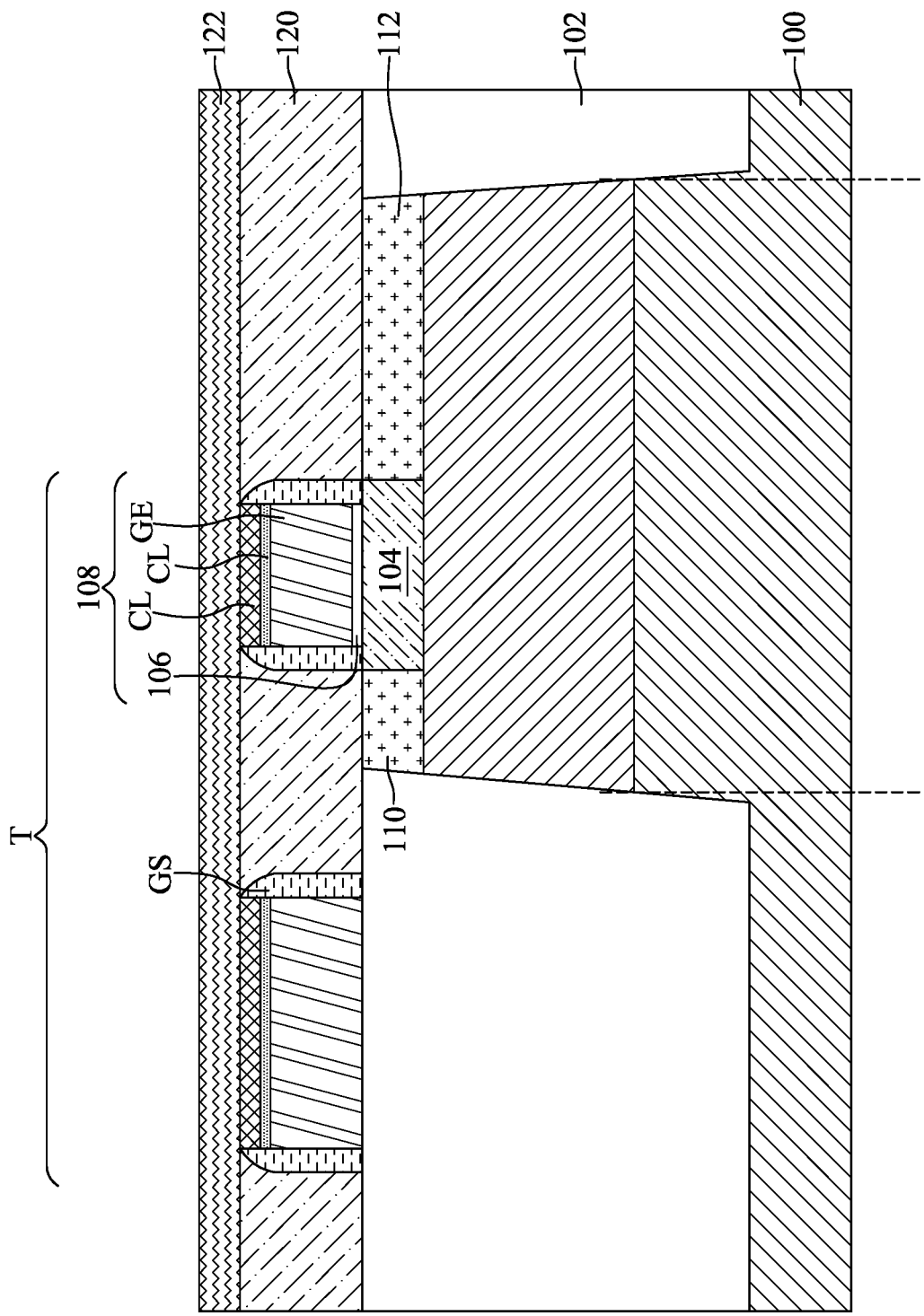

Referring to FIG. 2 and FIG. 3K, step S31 is performed, and the insulating layer 122 is formed on the insulating layer 120. In some embodiments, a method for forming the insulating layer 120 includes a deposition process, such as a CVD process. In addition, a planarization process may be further performed on the insulating layer 120. The planarization process may include, for example, a CMP process, an etching process or a combination thereof.

Figure 3L:
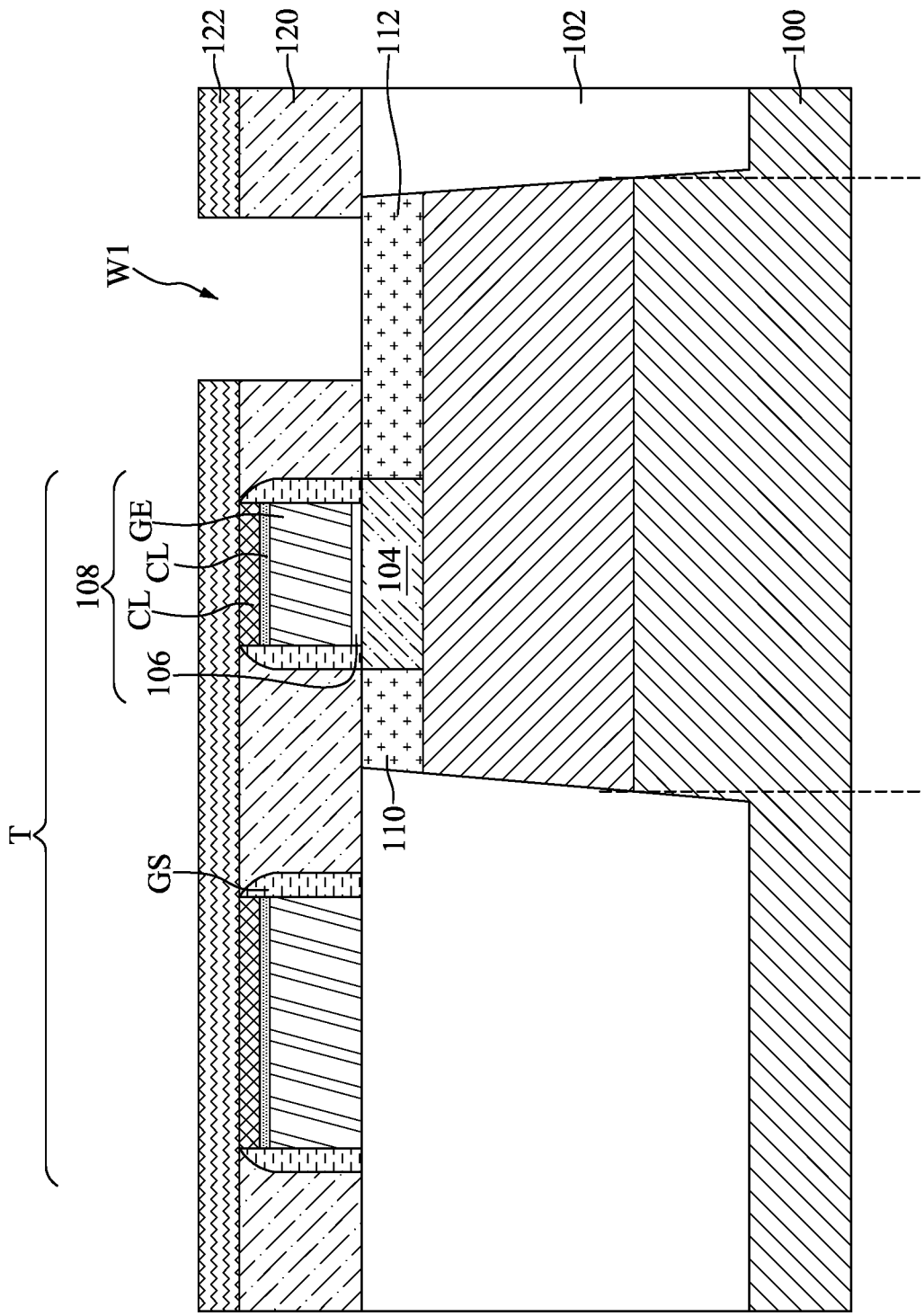

Referring to FIG. 2 and FIG. 3L, step S33 is performed, and an opening W1 is formed in the stack of the insulating layers 120, 122. The opening W1 will be filled with the dielectric layer 116 and the electrode 118 of the anti-fuse storage unit AF in the subsequent steps. A method for forming the opening W1 may include a lithography process and one or more etching process(es).

Figure 3M:
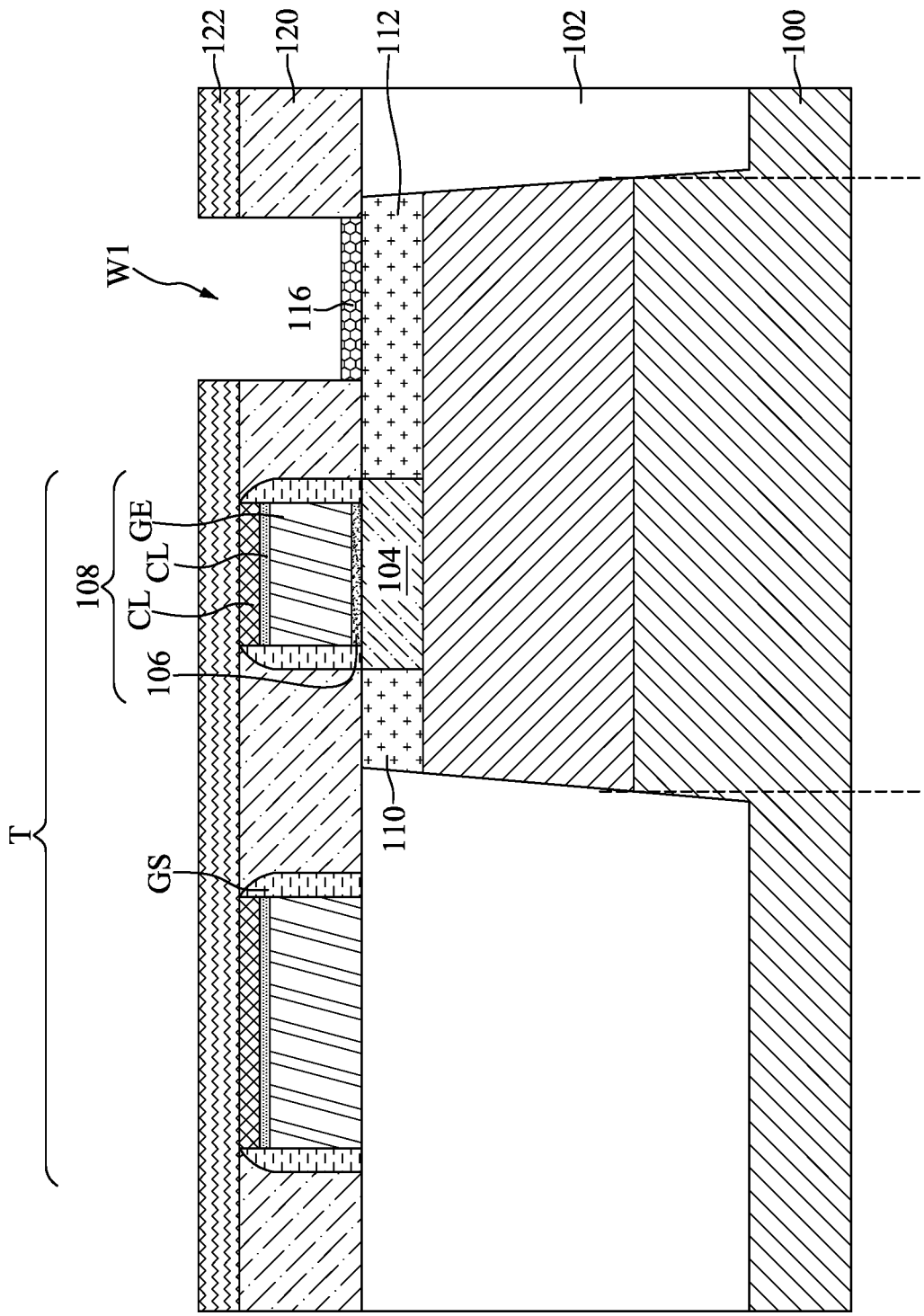

Referring to FIG. 2 and FIG. 3M, step S35 is performed, and the dielectric layer 116 is formed in the opening W1. In some embodiments, the dielectric layer 116 selectively cover a portion of the doped region 112 exposed by the opening W1. In such embodiments, a method for forming the dielectric layer 116 may include an oxidation process, and the formation of the dielectric layer 116 may be regarded as a self-align process.

Figure 3N:
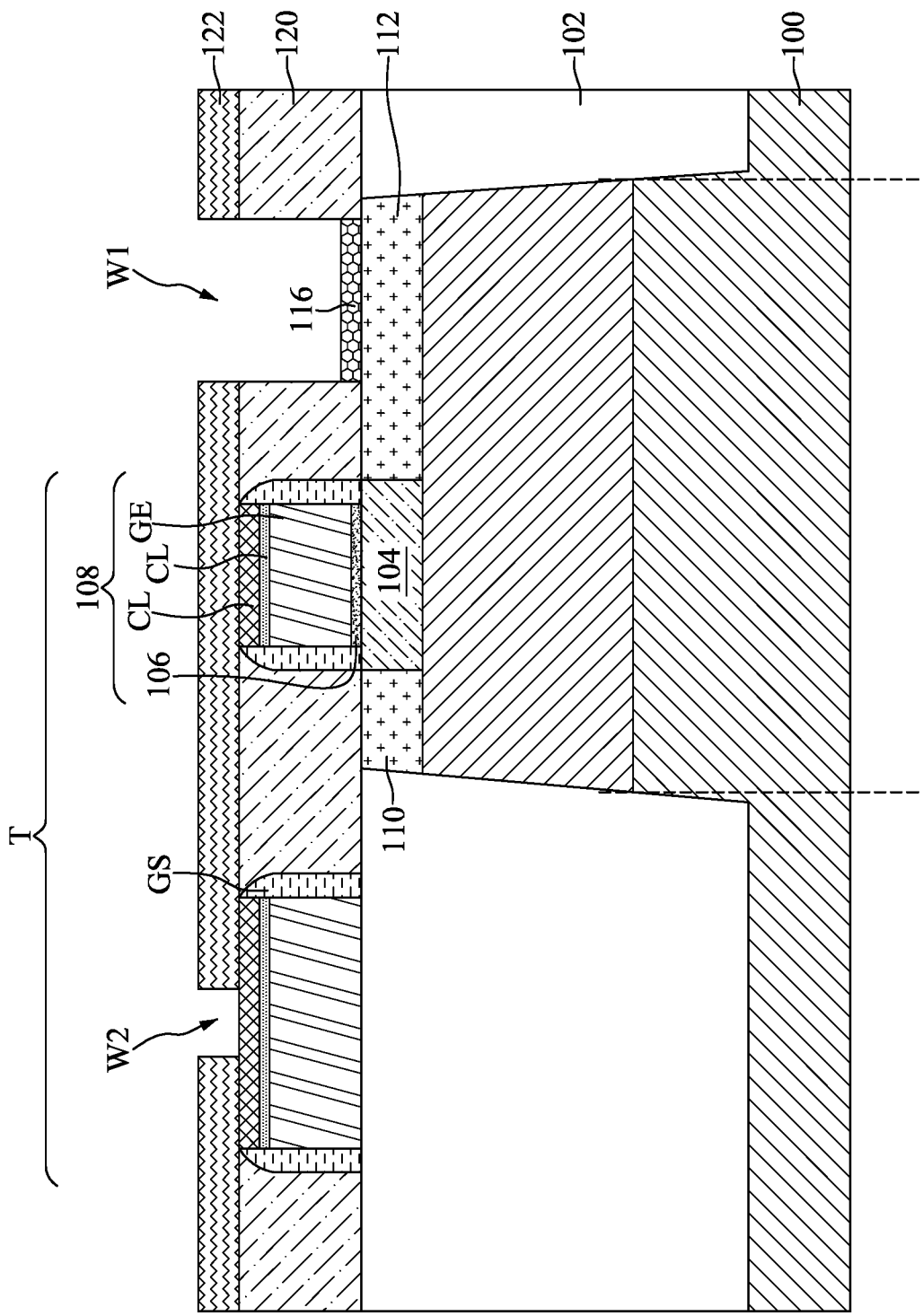
Figure 3O:
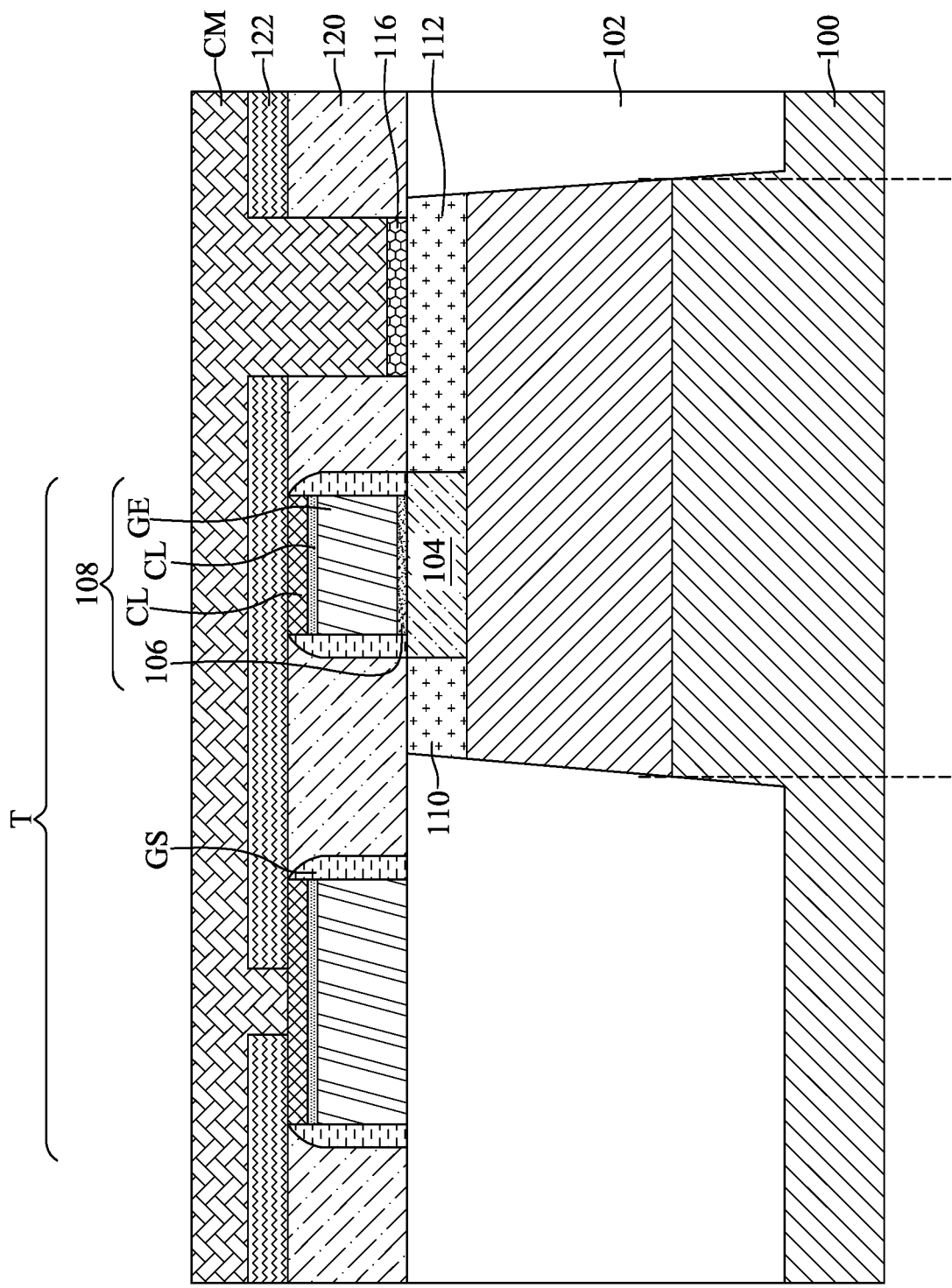

Referring to FIG. 2 and FIG. 3N, step S37 is performed, and an opening W2 is formed in the insulating layer 122. By disposing the opening W2, a location of the subsequently formed contact plug 114 can be defined. The opening W2 penetrates through the insulating layer 122, and exposes a portion of the gate structure 108. For instance, a top surface of the topmost contact layer CL of the gate structure 108 is exposed by the opening W2. In some embodiments, a method for forming the opening W2 includes a lithography process and an etching process.

Referring to FIG. 2 and FIG. 3O, step S39 is performed, and a conductive material CM is formed on the current structure. The conductive material CM will be patterned to form the electrode 118 and the contact plug 114 in the following step. Currently, the conductive material fills up the openings W1, W2, and covers a top surface of the insulating layer 122. In some embodiments, a method for forming the conductive material CM includes a deposition process (e.g., a physical vapor deposition (PVD) process), a plating process or a combination thereof.

Referring to FIG. 2 and FIG. 1B, step S41 is performed, and portions of the conductive material CM above the top surface of the insulating layer 122 are removed. On the other hand, portions of the conductive material CM are remained in the openings W1, W2, and form the electrode 118 and the contact plug 114. In some embodiments, a planarization process is used for forming the electrode 118 and the contact plug 114. For instance, the planarization process includes a CMP process, an etching process or a combination thereof.

Up to here, the manufacturing method for forming the memory device 10 has been completed. The memory device 10 may be further subjected to other process steps for forming additional components including, for example, a word line, a bit line, and a source line.

Figure 4:
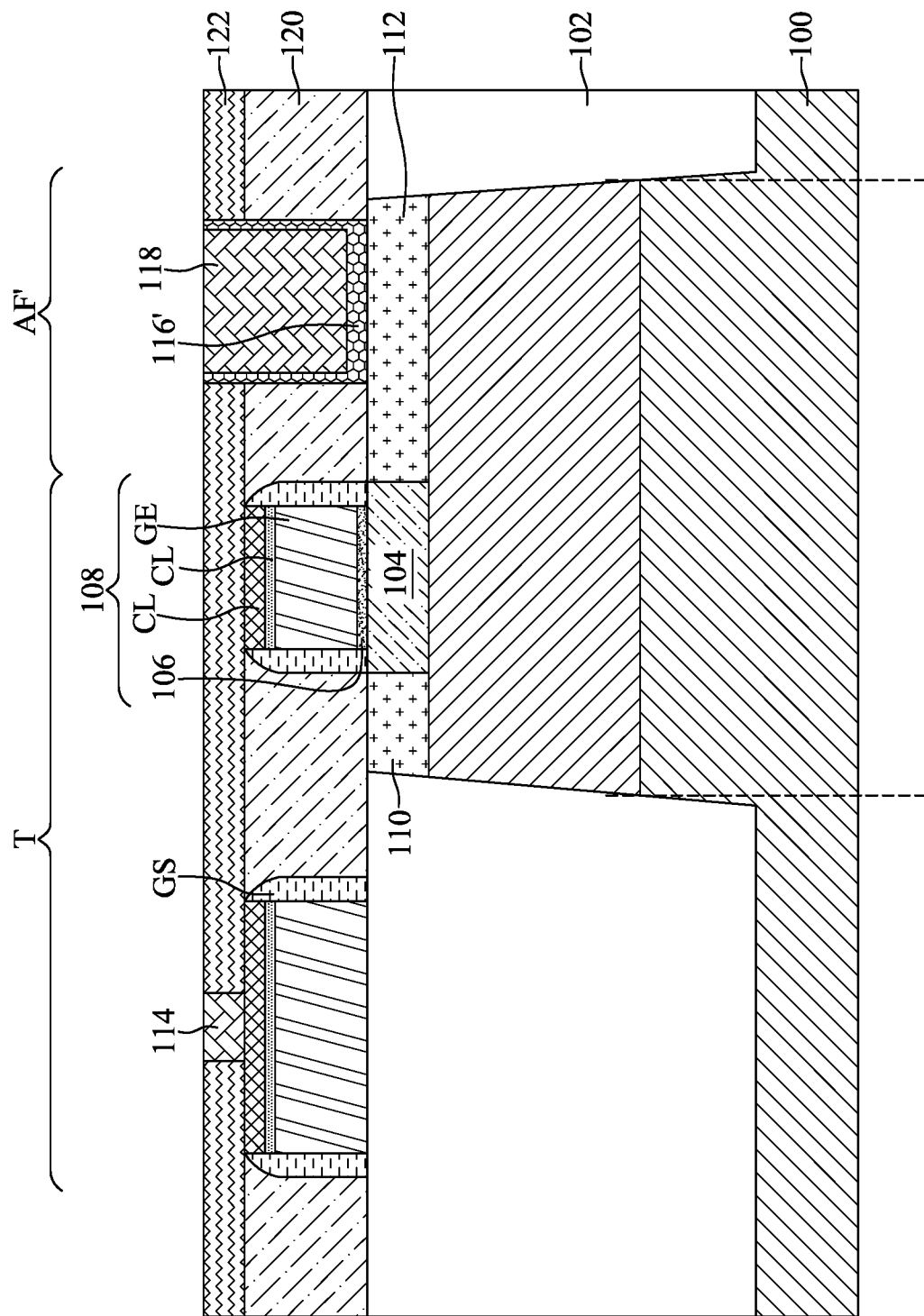
FIG. 4 is a schematic cross-sectional view of a memory device according to some embodiments of the present disclosure.

FIG. 4 is a schematic cross-sectional view of a memory device 10a according to some embodiments of the present disclosure.

Referring to FIG. 1B and FIG. 4, the memory device 10a shown in FIG. 4 is similar to the memory device 10 shown in FIG. 1B, except that a dielectric layer 116' of an anti-fuse storage unit AF' in the memory device 10a shown in FIG. 4 further covers sidewalls of the insulating layers 120, 122. In some embodiments, the dielectric layer 116' is conformally formed in the opening W1 as shown in FIG. 3M, then the electrode 118 is filled into the recess defined by the dielectric layer 116'. Accordingly, a bottom surface and a sidewall of the electrode 118 is covered by the dielectric layer 116'. In these embodiments, the dielectric layer 116' may be formed by a deposition process, such as a CVD process.

Figure 5:
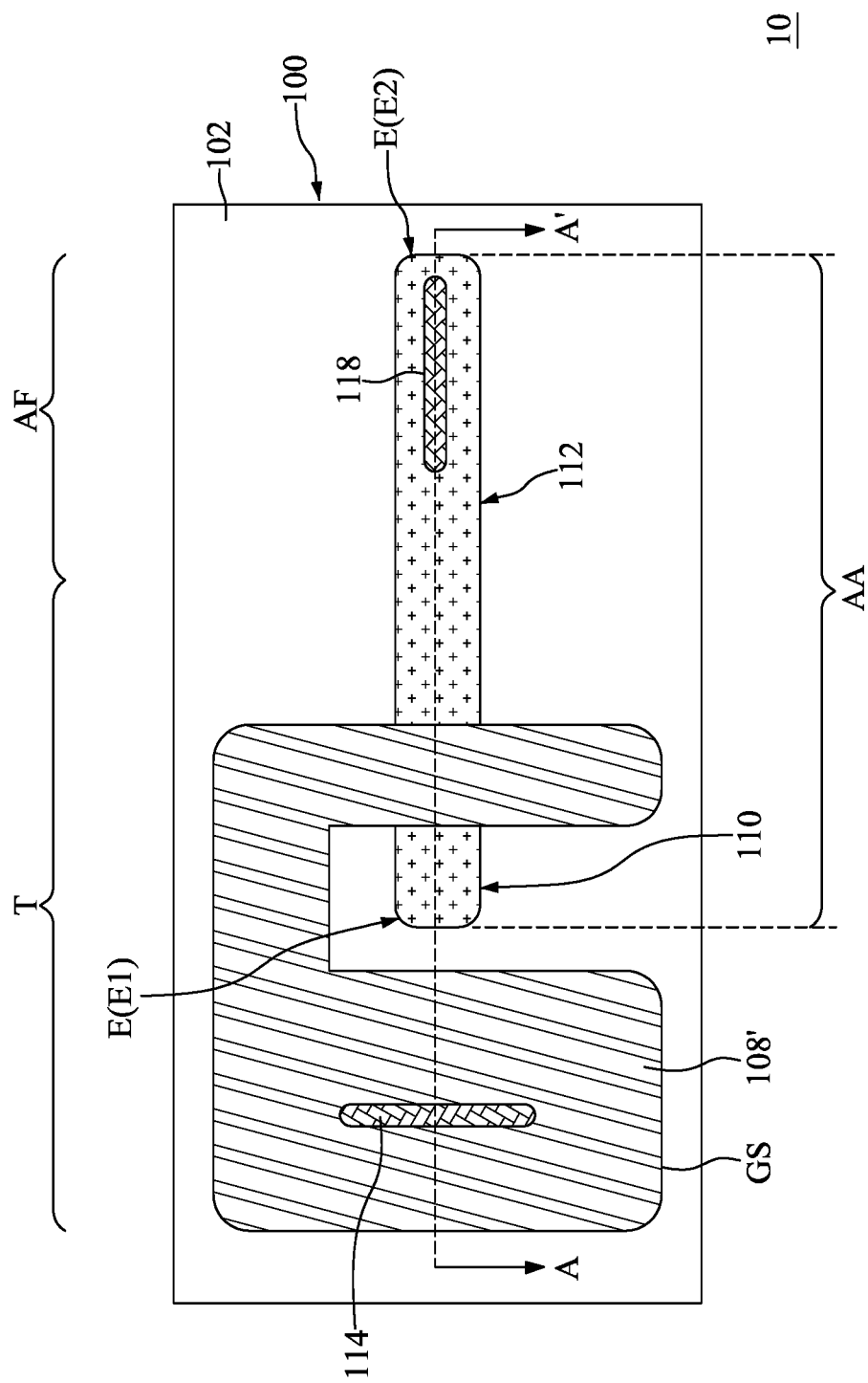
FIG. 5 is a schematic plan view of a memory device according to some embodiments of the present disclosure.

FIG. 5 is a schematic plan view of a memory device 10b according to some embodiments of the present disclosure. The memory device 10b shown in FIG. 5 is similar to the memory device 10 shown in FIG. 1A. Only differences therebetween will be described, the like or the same parts would not be repeated again.

Referring to FIG. 5, in some embodiments, the gate structure 108' is formed as an open ring, rather than a close ring. For instance, as shown in FIG. 5, a top view shape of the gate structure 108' may resemble a rotated "C" shape. The region overlapped with the end portion E1 of the active region AA is not completely surrounded by the gate structure 108'.

As above, the memory device according to embodiments of the present disclosure is a memory cell in an anti-fuse OTP memory array, and includes an access transistor and an anti-fuse storage unit connected to one of the source and drain terminal of the access transistor. The access transistor includes an active region formed in a substrate, and includes a gate structure formed on the substrate. The active region has a linear top view shape, and the gate structure has a linear portion intersected with a section of the active region. Such section of the active region is away from two end portions of the active region, which are particularly susceptible to lithography and/or etching inaccuracy. Therefore, an overlap area of the gate structure and the active region can be better controlled, thus a gate coupling area and a threshold voltage of the access transistor can be less affected by inaccuracy of the manufacturing process of the memory device.

In an aspect of the present disclosure, a memory device is provided. The memory device comprises: an active region, formed in a substrate and having a linear top view shape; a gate structure, disposed on the substrate and having a linear portion intersected with a section of the active region away from end portions of the active region; and an anti-fuse storage unit, using a portion of the active region as a terminal, and further comprising an electrode and a dielectric layer, wherein the electrode is disposed on the portion of the active region and spaced apart from the gate structure, and the dielectric layer is sandwiched between the portion of the active region and the electrode.

In another aspect of the present disclosure, a memory device is provided. The memory device comprises: an access transistor, comprising an active region formed in a substrate and a gate structure formed on the substrate, wherein the active region has a linear top view shape, the gate structure has a first portion and a second portion, the first portion is intersected with a section of the active region away from end portions of the active region, and the second portion is laterally spaced apart from the active region; and a capacitor, using a portion of the active region as a terminal, and further comprising an electrode and a dielectric layer, wherein the electrode is disposed on the portion of the active region and spaced apart from the gate structure, and at least a portion of the dielectric layer is sandwiched between the electrode and the portion of the active region.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A programmable memory device, comprising:
   an active region, formed in a substrate and having a linear top view shape;
   a gate structure, disposed on the substrate and having a first linear portion intersected with a section of the active region away from end portions of the active region and a second linear portion away from the first linear portion and the section of the active region, wherein one of the end portions of the active region is disposed between the first linear portion and the second linear portion of the gate structure; and
   an anti-fuse storage unit, using a portion of the active region as a terminal, and further comprising an electrode and a dielectric layer, wherein the electrode is disposed on the portion of the active region and spaced apart from the gate structure, and the dielectric layer is sandwiched between the portion of the active region and the electrode.

2. The programmable memory device according to claim 1, wherein the gate structure is formed in a ring shape.

3. The programmable memory device according to claim 2, wherein one of the end portions of the active region is overlapped with a region laterally surrounded by the gate structure.

4. The programmable memory device according to claim 1, wherein the gate structure is closer to a first one of the end portions of the active region than to a second one of the end portions of the active region, and the anti-fuse storage unit is closer to the second one of the end portions of the active region than to the first one of the end portions of the active region.

5. The programmable memory device according to claim 1, further comprising an isolation structure, formed in the substrate and laterally surrounding the active region.

6. The programmable memory device according to claim 5, wherein the gate structure is overlapped with the isolation structure and the section of the active region.

7. The programmable memory device according to claim 6, further comprising a gate dielectric layer selectively disposed between the gate structure and the section of the active region.

8. The memory device according to claim 7, wherein a thickness of the gate dielectric layer is different from a thickness of the dielectric layer of the anti-fuse storage unit.

9. The memory device according to claim 1, further comprising a gate spacer, covering a sidewall of the gate structure.

10. The programmable memory device according to claim 1, further comprising a contact plug, disposed on the gate structure and electrically connected to the gate structure.

11. The programmable memory device according to claim 10, wherein the contact plug is spaced apart from the active region.

12. The programmable memory device according to claim 10, wherein a top surface of the contact plug is substantially coplanar with a top surface of the electrode of the anti-fuse storage unit.

* * * * *